United States Patent [19]
Ishii et al.

[11] Patent Number: 5,438,586
[45] Date of Patent: Aug. 1, 1995

[54] APPARATUS WITH LIGHT-EMITTING ELEMENT AND METHOD FOR PRODUCING IT

[75] Inventors: Satoshi Ishii, Ohta; Tetsuharu Nishimura, Kawasaki; Koh Ishizuka, Omiya; Hiroshi Kondo, Kawasaki, all of Japan

[73] Assignee: Canon Kabushiki Kaisha, Tokyo, Japan

[21] Appl. No.: 156,634

[22] Filed: Nov. 24, 1993

[30] Foreign Application Priority Data

Nov. 30, 1992 [JP] Japan .................. 4-345553

[51] Int. Cl.⁶ ...................... G11B 7/14; H01S 3/18
[52] U.S. Cl. ...................... 372/50; 372/43; 369/122
[58] Field of Search .......... 372/43, 44, 45, 50, 372/24; 369/122

[56] References Cited

U.S. PATENT DOCUMENTS 4,182,977  1/1980  Stricklin, Jr. .................. 315/158

FOREIGN PATENT DOCUMENTS

| 199565 | 10/1986 | European Pat. Off. |  |
|---|---|---|---|
| 0140488 | 6/1987 | Japan | 372/43 |
| 62-196880 | 8/1987 | Japan | |
| 63-127444 | 5/1988 | Japan | |
| 0204781 | 8/1988 | Japan | 372/43 |
| 0106989 | 4/1990 | Japan | 372/43 |
| 4162222 | 6/1992 | Japan | 369/122 |
| 1748188 | 7/1992 | U.S.S.R. | 369/122 |

OTHER PUBLICATIONS

Waynant, R. W. and Marwood, N. F., *Electro-Optics Handbook* McGraw-Hill, Inc. N.Y. 1994 (No month available) pp. 27.12, 27.13, 27.25.
*Patent Abstracts of Japan*, vol. 16, No. 535 (Kokai 4-199890), Jul. 1992.
*Patent Abstracts of Japan*, vol. 14, No. 239 (Kokai 2-063182), Mar. 1990.
*Patent Abstracts of Japan*, vol. 11, No. 154 (Kokai 61-292389), Dec. 1986.
*Patent Abstracts of Japan*, vol. 6, No. 251 (Kokai 57-149780), Sep. 1982.
*Patent Abstracts of Japan*, vol. 11, No. 59 (Kokai 61-219186), Sep. 1986.

*Primary Examiner*—Rodney B. Bovernick
*Assistant Examiner*—Robert McNutt
*Attorney, Agent, or Firm*—Fitzpatrick, Cella, Harper & Scinto

[57] ABSTRACT

This invention relates to a light-emitting apparatus, a photosemiconductor apparatus and a method for producing a photosemiconductor wherein the light-emitting apparatus for emitting light on an object comprises a substrate; a light-emitting element provided on the substrate; an optical member provided on a predetermined position to the substrate; a light-receiving element provided on the substrate, the light-receiving element receiving a part of light beam emitted from the light-emitting element on the object via the optical member; and means for controlling a quantity of the beam projected from the light-emitting element on the object, based on an output signal from the light-receiving element.

3 Claims, 23 Drawing Sheets

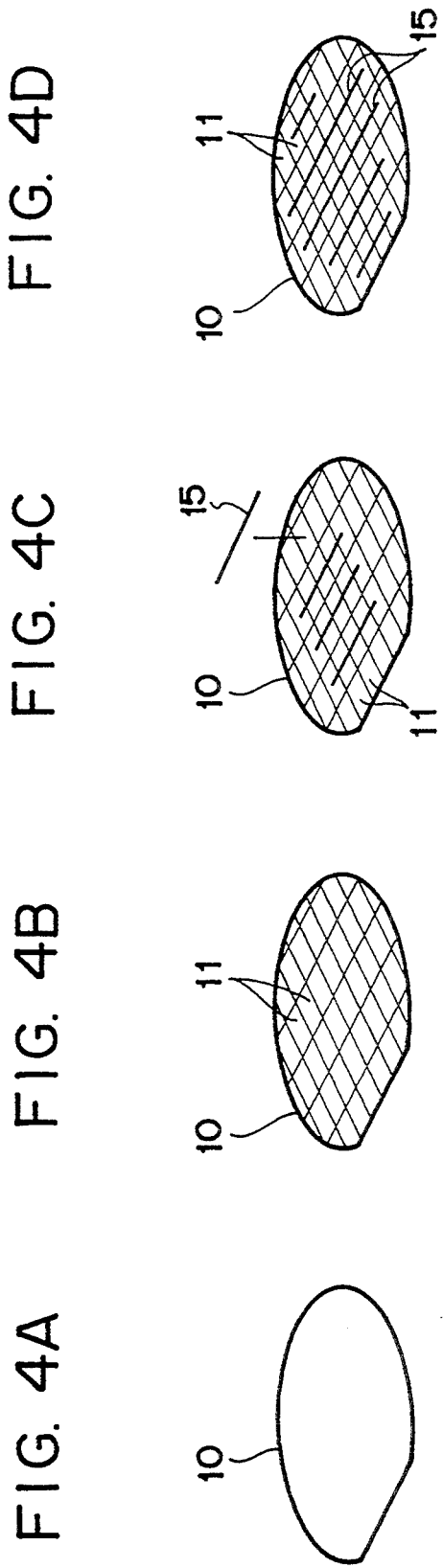

APPARATUS WITH LIGHT-EMITTING ELEMENT AND METHOD FOR PRODUCING IT

BACKGROUND OF THE INVENTION

1. Field of the Invention

The present invention relates to an apparatus having a light-emitting element and a method for producing it. More particularly, the invention relates to a light-emitting apparatus which is arranged to be able to control with high precision a quantity of emitted light from a light-emitting element such as a laser diode, and to a photosemiconductor element which can be used to obtain information about motion of a moving object by letting light beam emitted from a light-emitting element such as a laser diode illuminate the moving object and by detecting diffracted or scattered light subjected to phase modulation operation by motion of the moving object, as well as methods for producing such devices.

2. Related Background Art

There are various conventional light-emitting apparatus proposed, in which a light-emitting element such as a laser diode and a light-receiving element such as a photodiode are set in a single casing, a part of a light beam from the light-emitting element is received by the light-receiving element, and a light quantity of emitted outwardly light from the light-emitting element is controlled utilizing output signals from the light-receiving element.

FIG. 1 is a perspective view of major part for the laser diode in such a conventional light-emitting apparatus of this type.

In FIG. 1, reference numeral 1 designates a light-emitting element (laser diode), and 2 a light-receiving element (photodiode), which are mounted on a stem 3 also serving as a heat sink. They are covered with a cap 5 having an exit opening with a transparent glass plate 4, and the inside is filled with inert gas under hermetic seal. Each electrode for light-emitting element or light-receiving element is connected by wire bonding to a lead terminal which is led to the outside.

FIG. 2 and FIG. 3 are cross sectional views as extracted and exploded to show the light-emitting element 1 and the light-receiving element 2 shown in FIG. 1.

In case that the light-emitting element 1 is a laser diode, laser beams are emitted from both ends thereof. One beam 6 thereof is guided to the outside through the glass plate 4 on the package exit opening and is used as a light source. A part of another beam 7 is received by the light-receiving element 2 for a monitor.

Such apparatus is generally used to obtain a constant-power laser beam, generally using a control circuit (APC: Automatic Power Control) for controlling a current in the laser diode such that a quantity of light entering the light-receiving element 2 is always constant.

There are also various proposals for an apparatus in which light from a light-emitting element is made to illuminate an object (moving object) and diffracted or scattered light from the object is detected, whereby information as to the object's movement such as motion or displacement of the object is attained with high precision, for example optical encoders, laser Doppler velocimeters, laser interferometers, and the like. In addition, a variety of apparatuses such as compact disk, magneto-optical disk, CD-ROM, and the like have been proposed for obtaining desired information by making light irradiate an object.

In any of those apparatuses, set in a single casing are the light-emitting element as a light source, the light-receiving element for receiving optical signals and converting them into electric signals, and other optical elements such as lens, beam splitter, mirror, and the like. Since such apparatuses are constructed by assembling separate elements, precise adjustment is necessary for optical position of the elements, which requires much labor and time.

Further, it is expected that the size of each optical element will be further miniaturized in the future. In this occasion, the precision of optical position for each element must be enhanced in proportion to the size reduction.

For example, in Japanese Patent Application Laid-Open No. 62-196880 it is proposed a photosemiconductor apparatus for CD pickup is designed such that the size of entire system is more reduced.

The Japanese Patent Application Laid-Open No. 62-196880 discloses that a laser diode and a prism having a beam splitter function are respectively mounted on a semiconductor substrate on which a light-receiving unit is provided, signal light is guided to return on the same optical path as one through which light from the laser diode is guided to the outside, and the signal light is separated and reflected by the prism to obtain servo signals (signal light).

There have been proposed a variety of conventional production methods of photosemiconductor apparatus in which elements constituting such photosemiconductor apparatus are arranged at high precision on a semiconductor substrate.

An example method is a method in which a spherical collimating lens or the like is provided for a sealing cap of the laser diode, the spherical lens on the cap is aligned with a light-emitting source, and then the lens is fixed.

Japanese Patent Application Laid-Open No. 63-127444 proposes a production method as shown in FIGS. 4A to 4D and FIGS. 5A to 5D.

At the steps in FIGS. 4A and 4B, a light detection element is formed for each of plural chips (11) on a silicon wafer (10). At the step in FIG. 4C, mounted on the silicon wafer (10) are rod chip bars (15) each having a plurality of semiconductor lasers aligned in parallel with the direction perpendicular to the longitudinal direction of the chips (11). Then at the step in FIG. 4D, the silicon wafer (10) is heated to have the chip bar (15) melt-bonded to the silicon wafer. Further at the step in FIG. 5A, rod prisms (16) are bonded onto the light detection elements so as to be in parallel with the chip bars (15). Then the bonded prisms (16) and the silicon wafer is cut together to obtain a plurality of laser couplers at the same time as shown in FIG. 5B. FIG. 5B shows a laser coupler. Each laser coupler is completed after die bonding process and wire bonding one as shown in FIG. 5C and FIG. 5D, respectively.

In these production methods, the size of each optical element used is as small as a square of several mm to less than a square of 1 mm to obtain a smaller photosemiconductor apparatus.

In the laser coupler shown in FIGS. 4A, 4B, 4C, 4D and FIGS. 5A, 5B, 5C, 5D, a prism in the size of about 1.8×1.6×0.6 mm has functions for bending an output beam from the laser diode and for beam-splitting an input light.

SUMMARY OF THE INVENTION

The light-emitting apparatus shown in FIG. 1 could have a difference in beam emission pattern between two light beams emitted from the both upper and lower emission end faces due to deterioration with age of laser diode (light-emitting element) 1 or an optical damage on a light-emitting face and the like. In such a case, even if a current for laser diode 1 is so controlled as to make constant a light quantity of beam incident on the photodiode (light-receiving element) 2, a quantity of actually emitted light from the exit opening could still vary.

It is a first object of the present invention to provide a light-emitting apparatus which can keep always constant a quantity of light emitted from a light-emitting element to the outside by precisely monitoring the quantity of light emitted from the light-emitting element to the outside.

The aforementioned Japanese Patent Application Laid-Open No. 62-196880 discloses a photosemiconductor apparatus in which the size of entire apparatus is reduced by separating output light from signal light by a simple method in which the output light beam and the signal light beam pass forward and backward in the same optical path.

There is, however, a problem recognized for such an arrangement that the miniaturized light-emitting element and light-receiving element are set on a single substrate. The problem is that light emitted from the light-emitting element could directly or indirectly enter the light-receiving element as noise light to lower the S/N ratio greatly.

It is a second object of the present invention to provide a photosemiconductor apparatus which is free of bad influence of noise light and which can detect signal light with high precision.

Also, the aforementioned Japanese Patent Application Laid-Open No. 63-127444 discloses a method for producing a photosemiconductor apparatus, which requires an extremely high positional precision for prism. It is, however, very difficult to achieve such a very high positional precision because the size of the prism is too compact. The size of the prism has therefore been enlarged to ease recognition of positional precision deviation upon mounting thereon and thereby designed so as to keep the positional precision constant.

However, such a method to enlarge the apparent size of such optical element having a bar shape could be effective for inclination ($\theta$) of optical element in mounting, but rarely effective for distance relation (XY) between the light-emitting element and the optical element.

Let us consider an example in which a lens condenses light folded by a prism. If the focal length between the emission light source and the lens are relatively long, a positional deviation rarely affects the positional relation. In contrast, if a small-size lens is used to reduce the size, the focal length becomes shorter and a too-accurate requirement is needed for the positional relationship between the optical elements and the light-emitting source.

The method for miniaturizing an optical apparatus by reducing the size of optical elements as described requires an incommensurable precision for mounting the optical elements and the light-emitting element, as compared with the conventional methods. For the above reason, there are problems of increase in load against the apparatus and complication of the entire apparatus.

It is a third object of the present invention to provide a method for producing a photosemiconductor apparatus which can readily but precisely locate the elements such as a laser diode (light-emitting element) and a prism at respectively predetermined positions on a substrate.

An aspect of apparatus having a light-emitting element of the present invention, achieving the above object thereof, is a light-emitting apparatus for emitting light toward an object, comprising:

a substrate;

a light-emitting element provided on the substrate;

an optical member provided on a predetermined position to said substrate;

a light-receiving element provided on the substrate, the light-receiving element receiving via the optical member a part of light beam emitted from the light-emitting element toward the object; and means for controlling a quantity of the beam projected from the light-emitting element on the object, based on an output signal from the light-receiving element.

In a preferable aspect of the above apparatus, the light-emitting element and the light-receiving element are set in a casing filled with inert gas in a hermetic sealing condition and the optical member is fixed on the casing to shield the inside of the casing from the outside thereof.

Preferable light quantity control means for the above aspect is disposed in the casing.

In another aspect of the present invention, a photosemiconductor apparatus comprises:

a light-emitting element provided on a substrate, the light-emitting element emitting light on an object;

a light shield member provided on the substrate; and a light-receiving element provided on the substrate, the light-receiving element receiving through a non-shielding portion of the light shield member signal light emitted from the light-emitting element to the object and then reflected from the object, wherein noise light except for said signal light is removed with said light shield member.

In a preferable aspect of the above apparatus, an optical path of light emitted from the light-emitting element to the object is different from an optical path of the signal light reflected from the object.

In a preferable aspect of the above apparatus, the light-receiving element for detecting light according to an output from the light-emitting element is provided on the substrate.

In another aspect of the present invention, a method for producing a photosemiconductor apparatus, comprises steps of:

forming a projection linearly extending in a predetermined direction on a substrate and along the surface of the substrate;

forming a plurality of light-emitting elements on a mount member having a linear side surface and in a direction in parallel with the linear side surface;

forming the mount member on the substrate so that the side surface of the projection coincides with the side surface of the mount member;

forming an optical member in a direction in parallel with the predetermined direction on the substrate and along the surface of the substrate; and dividing and cutting the substrate thus obtained into a region including at least one of the plurality of light-emitting elements and a portion of the optical member.

The apparatus having the light-emitting element of the present invention and specific examples of production method thereof will be described in detail with some embodiments thereof.

BRIEF DESCRIPTION OF THE DRAWINGS

FIGS. 4A, 4B, 4C and 4D are schematic views to illustrate a conventional method for producing a photosemiconductor apparatus;

DETAILED DESCRIPTION OF THE PREFERRED EMBODIMENTS

Figure 1:
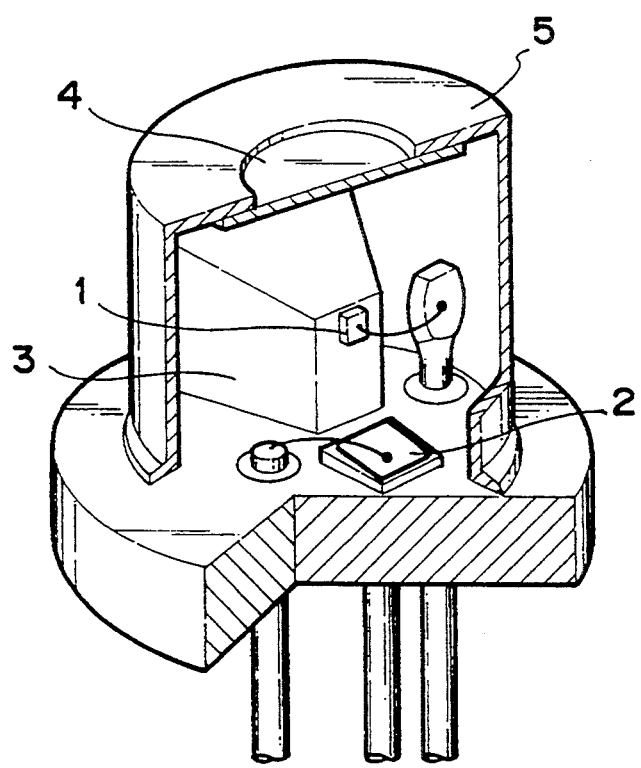
FIG. 1 is a schematic view to show a major part of a conventional light-emitting apparatus.
Figure 2:
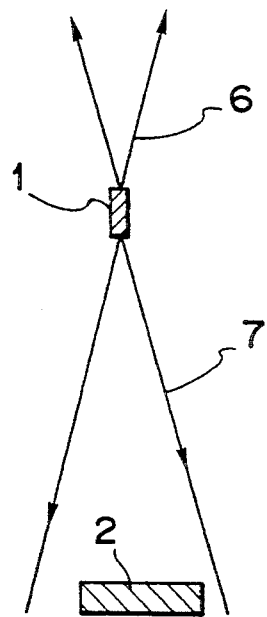
FIG. 2 is an explanatory view to show a part of the apparatus shown in FIG. 1.
Figure 3:
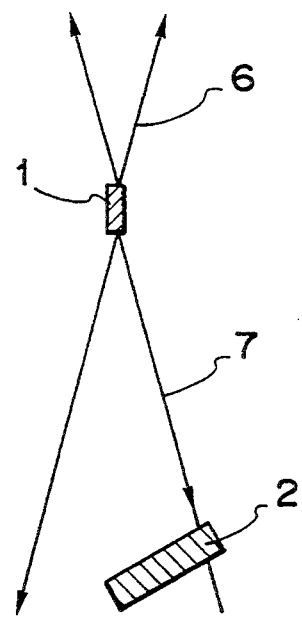
FIG. 3 is an explanatory view to show a part of the apparatus shown in FIG. 1.
Figure 5D:
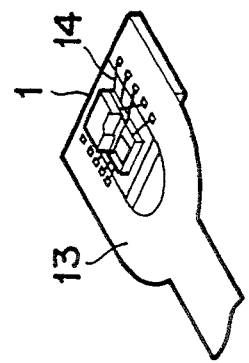
FIGS. 5A, 5B, 5C and 5D are schematic views to illustrate a conventional method for producing a photosemiconductor apparatus.
Figure 5C:
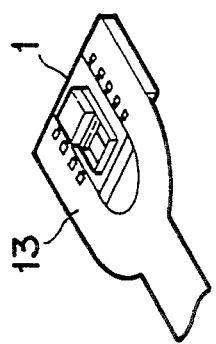
Figure 5B:
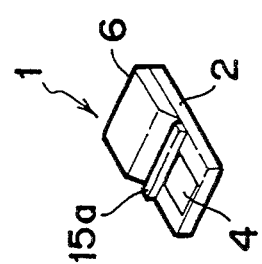
Figure 5A:
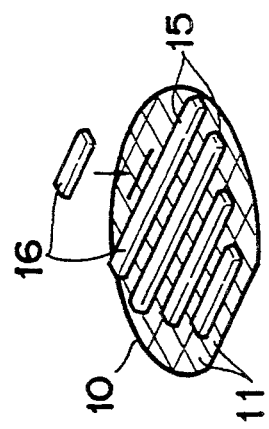
Figure 6A:
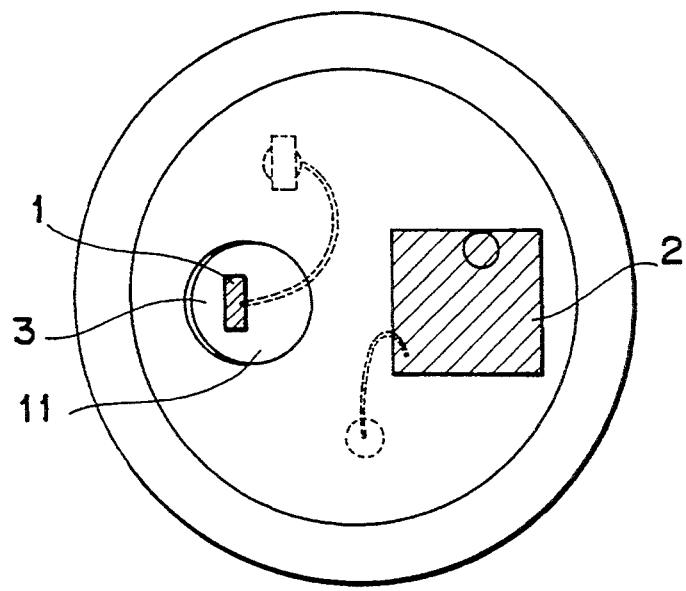
FIGS. 6A and 6B are schematic views to show a major part of Embodiment 1 of light-emitting apparatus according to the present invention.
Figure 6B:
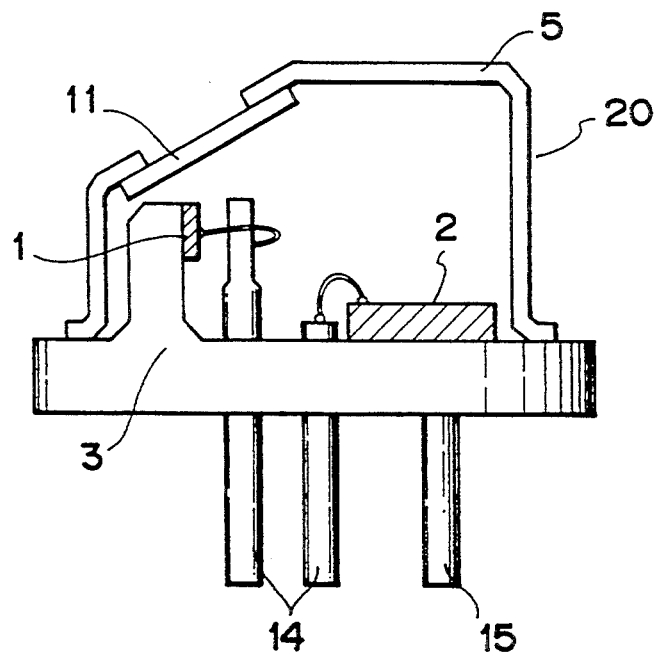
Figure 7:
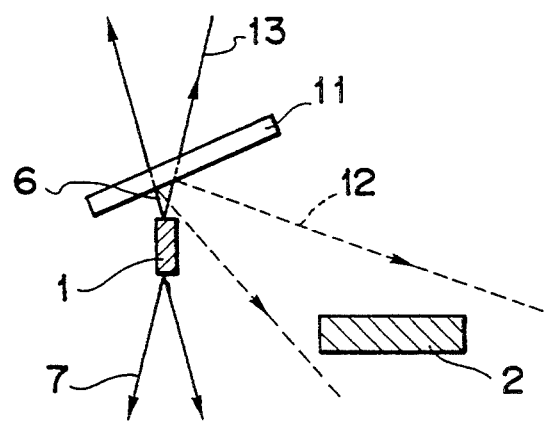
FIG. 7 is an explanatory view to show an exploded optical path which is a part of optical path shown in FIG. 6.

FIGS. 6A and 6B are a plan view and a cross sectional view, respectively, to show a major part in mount structure including elements in Embodiment 1 of light-emitting apparatus according to the present invention, and FIG. 7 is an explanatory drawing to show by exploding a part of the optical path as shown in FIGS. 6A and 6B.

In the Figures, numeral 1 designates a light-emitting element such as a laser diode, LED and SLD (super luminescent diode), 2 designates a light-receiving element such as a photodiode, a phototransistor and a CdS, 6 designates a light beam emitted from one end face of the light-emitting element 1 to the outside, 7 designates a beam emitted from another face of the light-emitting element 1 towards inside a package (casing) 20, 11 designates an optical member such as a transparent glass plate or a half-mirror, 12 designates a light beam reflected by the optical member 11, and 13 designates a light beam outgoing to the outside of package 20. Herein numeral 3 denotes a stem also serving as a heat sink, on which the light-emitting element 1 and the light-receiving element 2 are mounted. Numeral 5 denotes a cap, on which the optical member 11 is provided as a part of a light beam outgoing opening and which is mounted on the stem 3 by a hermetic sealing with inert gas filling the inside.

Each electrode of the light-emitting element 1 and the light-receiving element 2 is connected by wire bonding to a lead terminal 14, which is led to the outside. A lead terminal 15 directly leads a common electrode from the stem 3 to the outside.

In some cases, there are other elements than the above elements, such as light source driving means or IC, mounted in the package 20.

In the present embodiment, most of the light beam 6 emitted from the light-emitting element 1 passes through the optical member 11 and is emitted to the outside as the beam 13. A part of light beam 6 is, however, reflected by the optical member 11 and a part of the reflected beam then enters the light-receiving element 2 as the light beam 12.

In the present embodiment, as described above, the elements, i.e., the light-emitting element 1, the light-receiving element 2 and the optical member 11, are properly arranged so that the light beam 13 outgoing as light source to the outside and the light beam 12 entering the light-receiving element 2, both are obtained from the light beam emitted from the same end face of the light-emitting element 1.

Then a quantity of light emitted from the light-emitting element 1 and emitted to the outside is controlled utilizing signals obtained from the light-receiving element 2. As so arranged, a quantity of light supplied from the light-emitting element 1 to the outside is controlled to be always constant even if an emission pattern or a quantity of emitted light is deteriorated with age on the other face of the light-emitting element 1.

Figure 8:
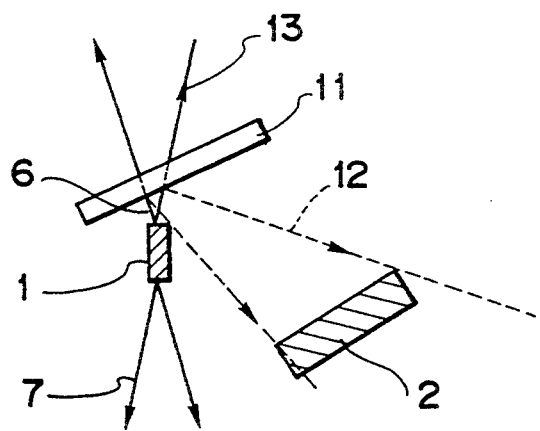
FIG. 8 is a schematic view to show a major part of Embodiment 2 of light-emitting apparatus according to the present invention.

FIG. 8 is an explanatory view to show by exploding a part of optical path in Embodiment 2 of light-emitting apparatus according to the present invention.

The present embodiment is substantially as same in structure as Embodiment 1 in FIG. 7 except that a mount angle of the light-receiving element 2 is changed to increase an amount of receiving light from the light beam 12.

Figure 9:
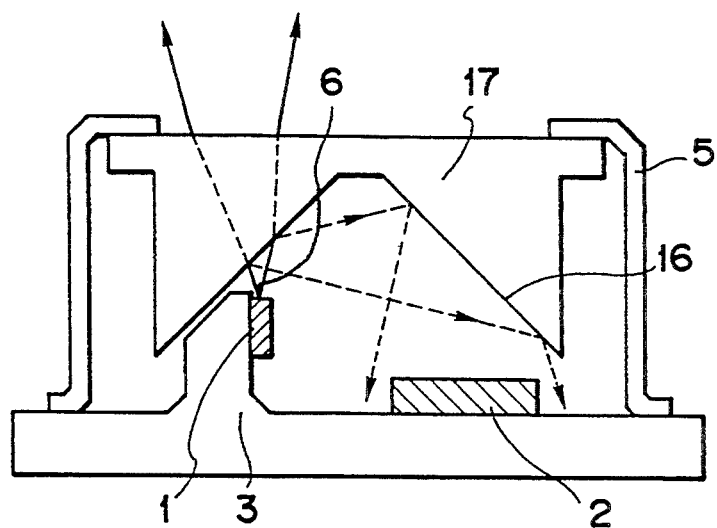
FIG. 9 is a schematic view to show a major part of Embodiment 3 of light-emitting apparatus according to the present invention.
Figure 10:
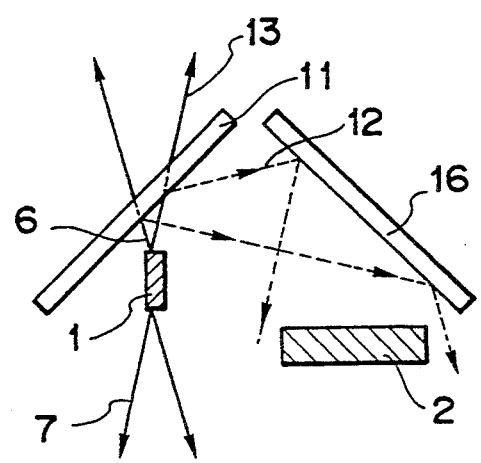
FIG. 10 is an explanatory view to show by exploding a part of the optical path shown in FIG. 9.

FIG. 9 is a cross sectional view to show a major part of mount structure in Embodiment 3 of light-emitting apparatus according to the present invention, and FIG. 10 is an explanatory drawing to show by exploding the optical path which is a part of optical path in FIG. 9.

The present embodiment is substantially the same in structure as Embodiment 1 in FIG. 7 except that a mirror 16 is further added and that a prism member 17 in which the optical member 11 and the mirror 16 are integrally formed, is used. In the present embodiment, out of the light beam 6 emitted from the light-emitting element 1, the light-receiving element 2 receives a light beam 12 reflected by the optical member 11 and the mirror 16.

Figure 11:
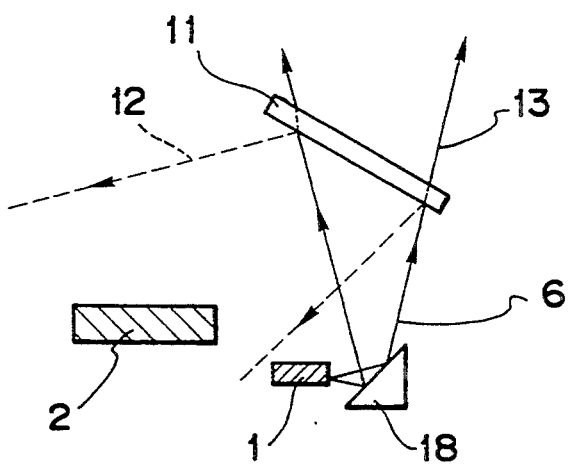
FIG. 11 is a schematic view to show a major part of Embodiment 4 of light-emitting apparatus according to the present invention.
Figure 12:
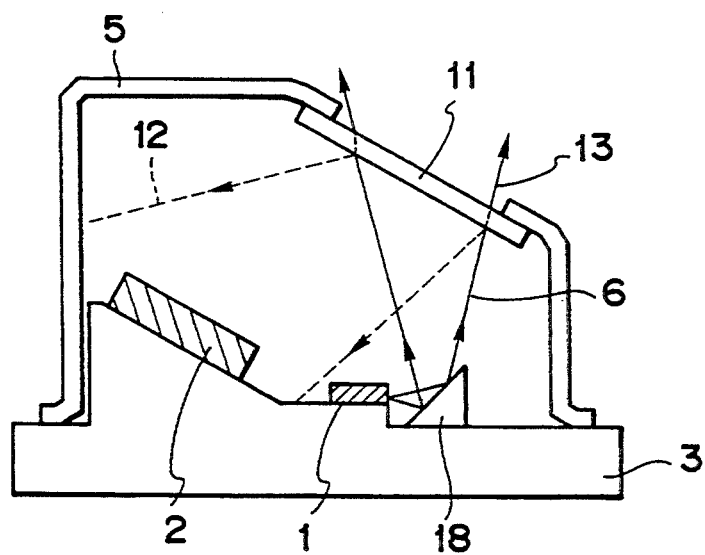
FIG. 12 is a schematic view to show a major part of Embodiment 5 of light-emitting apparatus according to the present invention.
Figure 13:
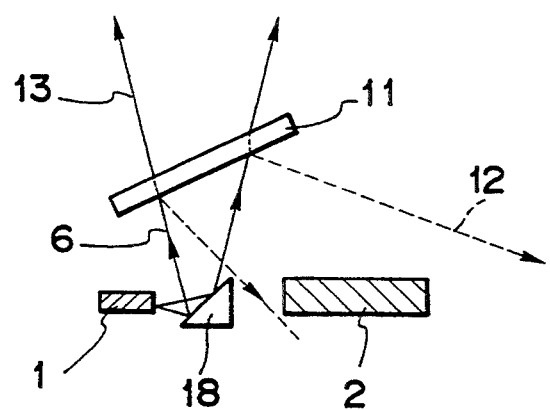
FIG. 13 is a schematic view to show a major part of Embodiment 6 of light-emitting apparatus according to the present invention.

FIG. 11, FIG. 12 and FIG. 13 are schematic views to respectively show a major part of Embodiment 4, 5 and 6 of light-emitting apparatus according to the present invention.

Embodiment 4 in FIG. 11 is substantially the same in structure as Embodiment 1 in FIG. 7 except that the arrangement direction of the light-emitting element 1 is changed such that the light beam 6 emitted from the light-emitting element 1 is reflected by a prism mirror 18 and thereafter the reflected beam is guided to the optical member 11.

Embodiment 5 in FIG. 12 is substantially the same in structure as Embodiment 4 in FIG. 11 except that a mount angle of the light-receiving element 2 is changed to increase an amount of receiving light from the light beam 12 reflected by the optical member 11.

Embodiment 6 in FIG. 13 is substantially the same in structure as Embodiment 4 in FIG. 11 except that an inclination direction of optical member 11 and the location of light-receiving element 2 are changed.

In Embodiments 1 to 6 of light-emitting apparatus according to the present invention, a polarizing member which can split a light beam by utilizing polarization may be employed as the optical member 11.

The light-emitting apparatus of the present invention can keep a quantity of light emitted to the outside always constant by either of the above arrangements of elements independently of a deterioration of the light-emitting element with age.

Figure 14:
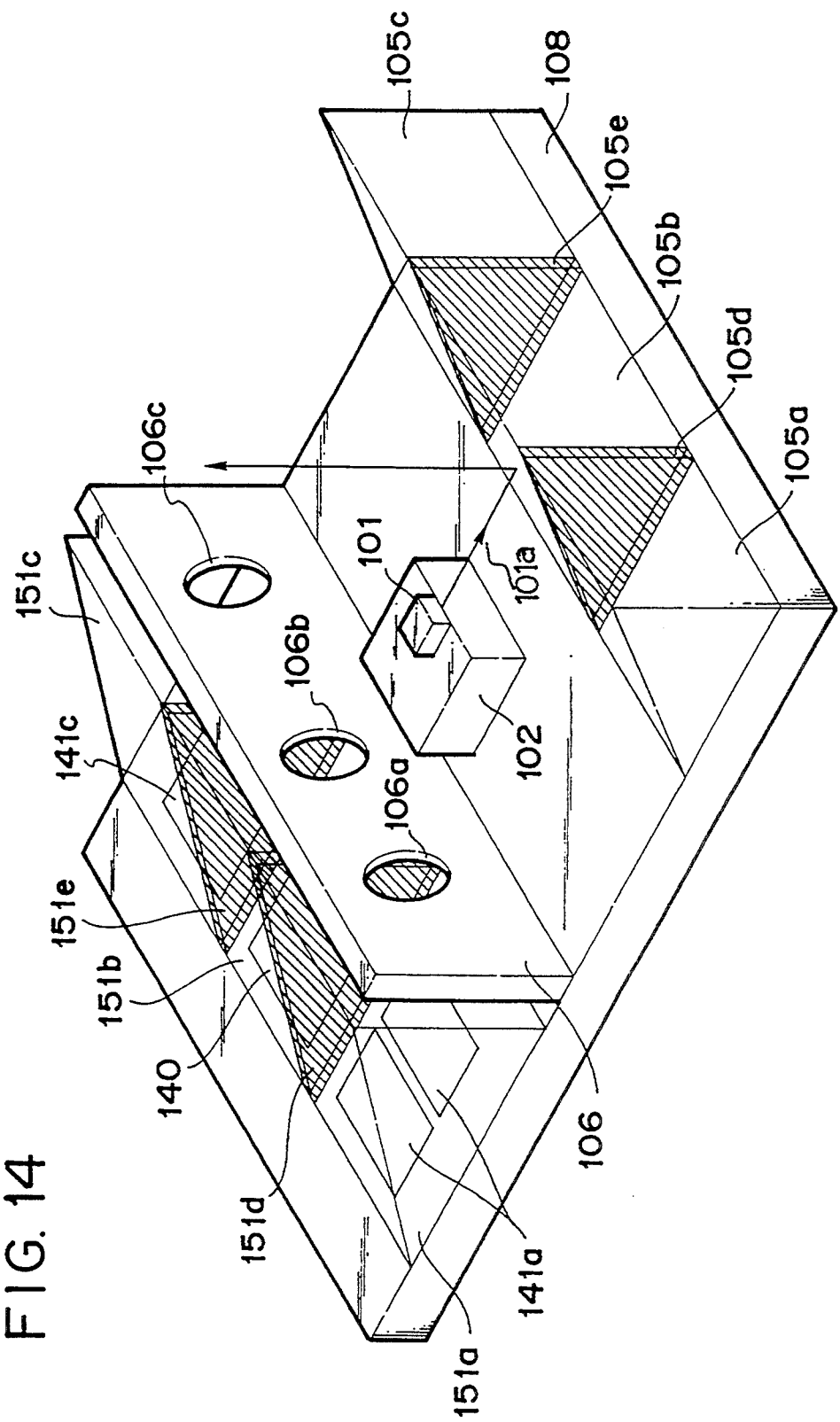
FIG. 14 is a perspective view to show a major part of Embodiment 7 of photosemiconductor apparatus according to the present invention.
Figure 15:
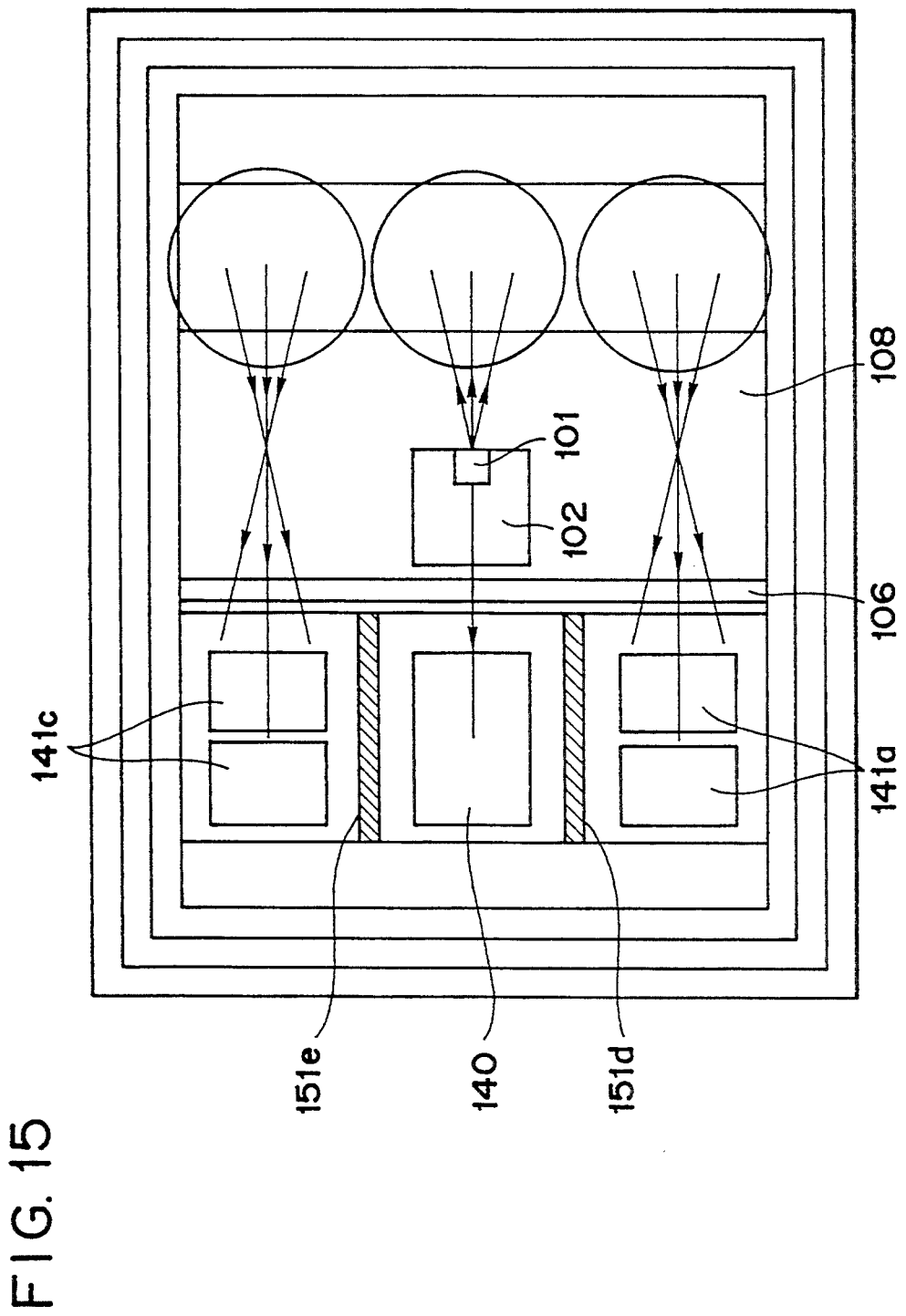
FIG. 15 is a plan view to show a major part of Embodiment 7 of photosemiconductor apparatus according to the present invention.
Figure 16:
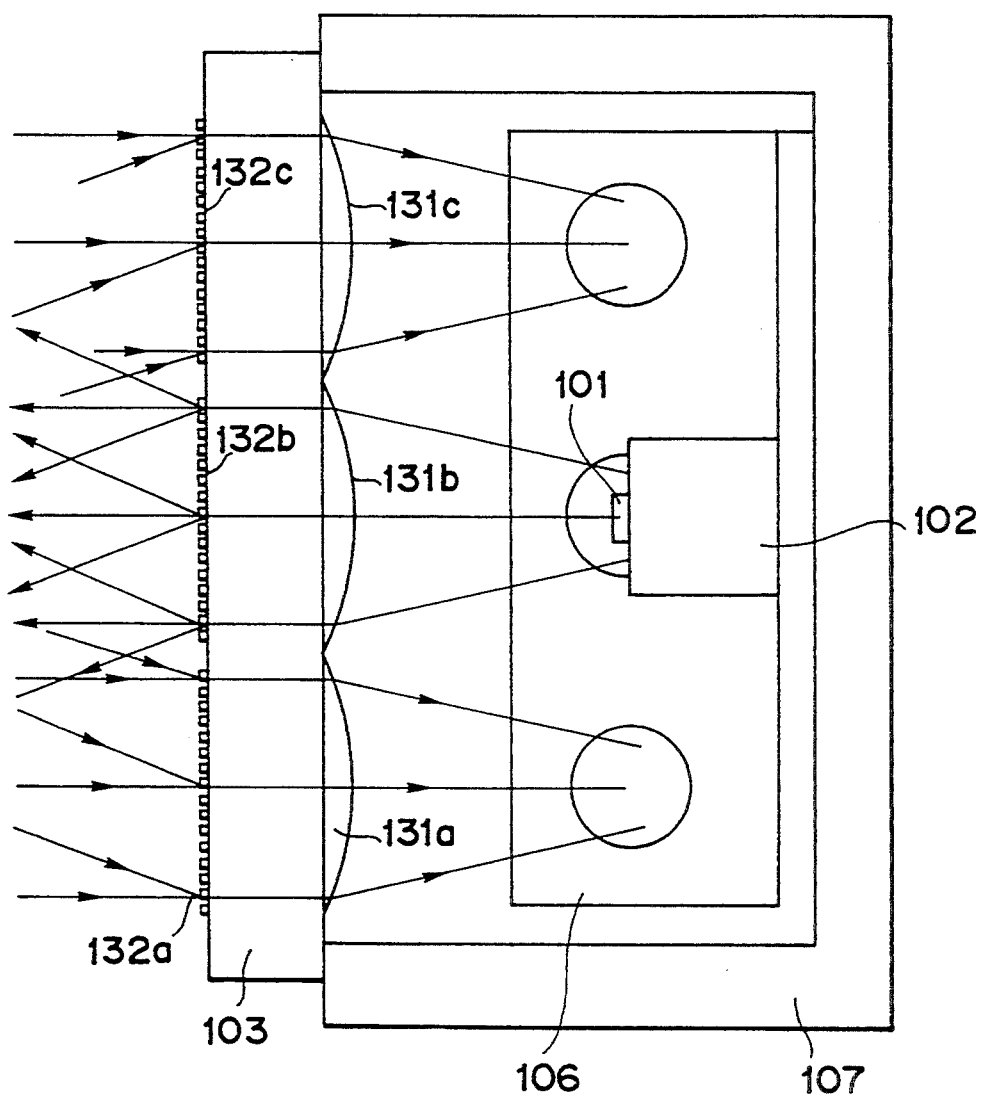
FIG. 16 is an explanatory view to show a part of Embodiment 7 of photosemiconductor apparatus according to the present invention.
Figure 17:
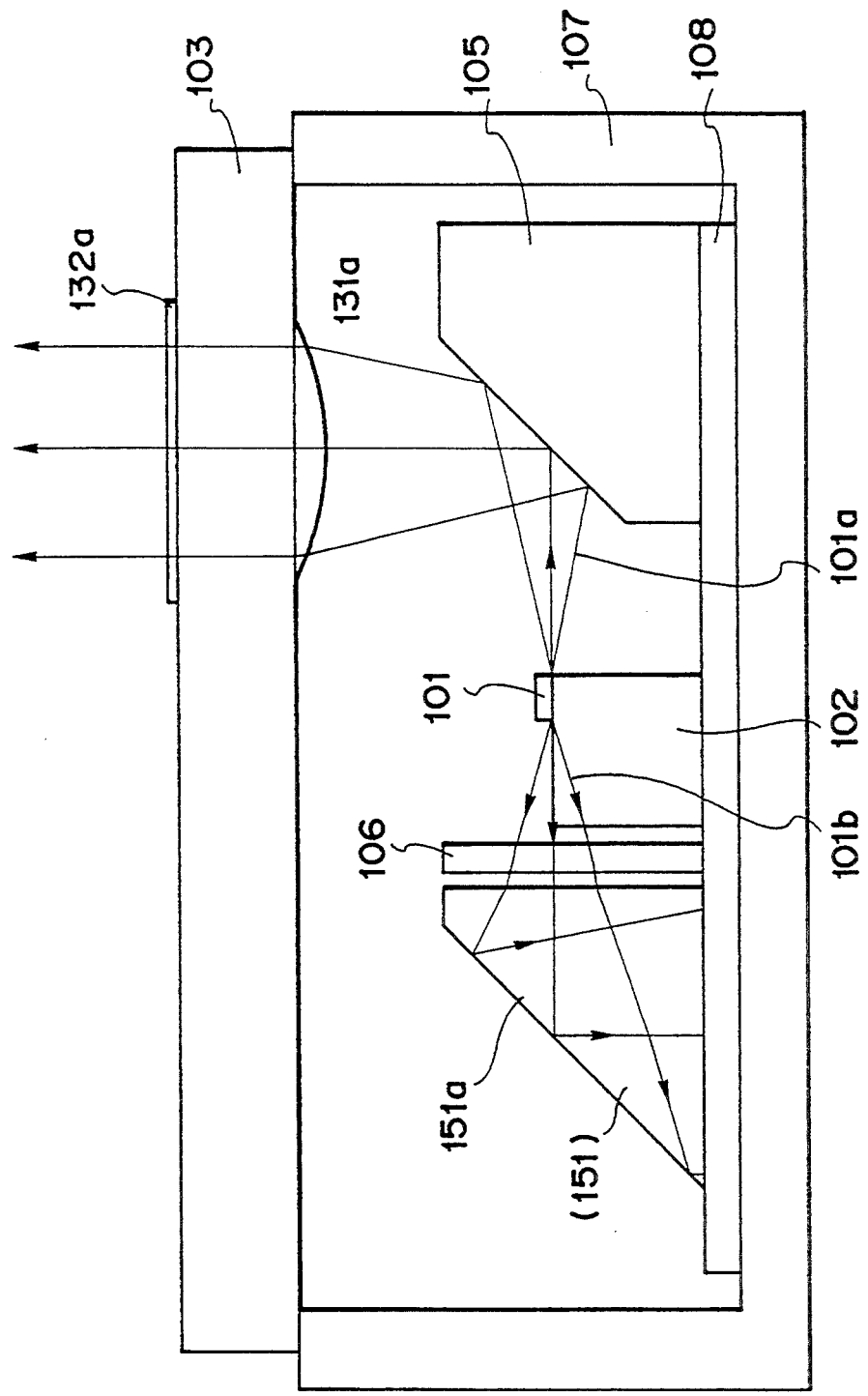
FIG. 17 is a cross sectional view of the major part of Embodiment 7 of photosemiconductor apparatus according to the present invention.

FIG. 14 is a perspective view to show a major part of a portion of Embodiment 7 of apparatus having a light-emitting element, and FIG. 15, FIG. 16 and FIG. 17 are a plan view of major part of the present invention, a schematic view of a portion, and a cross sectional view of major part, respectively, to show Embodiment 7 of photosemiconductor apparatus.

In the drawings, numeral 101 designates a light-emitting element such as a laser diode, LED and SLD, which is mounted on a sub-mount 102. The light-emitting element 101 emits a light beam 101a from one end face and a light beam 101b from the other end face. The sub-mount 102 is provided on the surface of semiconductor substrate 108. Numeral 105 denotes a reflecting prism with a reflective surface of slant surface, in which three reflecting prisms 105a, 105b, 105c are incorporated through light absorbing members 105d, 105e in between. Among them, the reflecting prism 105b reflects an output light beam 101a emitted from the light-emitting element 101, and thereafter enters a lens 131b in optical unit 103 as described below.

Numeral 103 is an optical unit, which includes three lenses 131a, 131b, 131c corresponding to the three reflecting prisms 105a, 105b, 105c on one surface thereof and three gratings 132a, 132b, 132c corresponding to the three lenses 131a, 131b, 131c on the other surface thereof. Among them, the lens 131b condenses the light beam (output beam) 101a emitted from the light-emitting element 101 and then reflected by the reflecting prism 105b and forms the light beam as a parallel light beam to enter the grating 132b.

Numeral 106 denotes a light shield member, in a portion of which three openings 106a, 106b, 106c are provided corresponding to the three reflecting prisms 105a, 105b, 105c. The light shield member 106 is formed for example by applying etching to a metal plate or by perforating a light-shielding film.

Numeral 151 is a light-guide prism, in which three prisms 151a, 151b, 151c each with reflective surface having slant surface are incorporated through light absorbing members 151d, 151e in between. The light-guide prism 151 reflects by its reflective surface a beam passing through an opening in the light shield member 106 and thereafter guides it to a light-receiving element (140, 141a, 141c) as described below.

Numeral 140 designates a light-receiving element for APC (Automatic Power Control), and 141 (141a, 141c) light-receiving elements for signal light. The light-receiving elements 140, 141a, 141c are provided on the surface of the same semiconductor substrate 108. Numeral 107 represents a package.

In the present embodiment, the output light 101a emitted from the light-emitting element 101 is reflected by the reflecting prism 105b, the reflected light is condensed by the lens 131b to be changed into a parallel beam, and the parallel beam then enters the grating 132b. The grating 132b diffracts the output light 101a and the diffracted light irradiates an object (not shown) located in a predetermined direction. For example, the object corresponds to a moving object in case that the photosemiconductor apparatus of the present invention is applied to a linear encoder or the like.

Signal light reflected by the object passes through the grating 132a (132c), diffracted light is condensed by the lens 131a (131c), the condensed light is reflected by the reflecting prism 105a (105c), and thereafter the reflected light enters the opening 106a (106c) in the light shield member 106.

The light-guide prism 151a (151c) guides the signal light passing through the opening 106a (106c) in the light shield member 106, onto the light-receiving element 141a (141c). Information as to movement of the moving object is detected using signals from the light-receiving element 141a (141c).

On the other hand, the light beam 101b emitted from the other end of light-emitting element 101 passes through the opening 106b in the light shield member 106 and then passes through the light-guide prism 151b to enter the light-receiving element 140 for APC. An amount of light emitted from the light-emitting element 101 is controlled using signals from the light-receiving element 140.

In the present embodiment, the projecting light path where the output light 101a is emitted from the light-emitting element 101 to be incident on the object is made different from the receiving light path where the returning light is reflected by the object to be returned the light-receiving element 141a (141c).

In the present embodiment, there is provided the light shield member 106 having the openings 106a, 106c corresponding to the spot size of signal light in front of the light-guide prism 151 to thereby separate the signal light from the output light 101a, whereby noise light can be effectively prevented from entering the light-receiving element 140 for APC or the light-receiving elements 141a, 141c for signal light. This permits the light-receiving elements 141a, 141c to obtain signals having a high S/N ratio.

Figure 18:
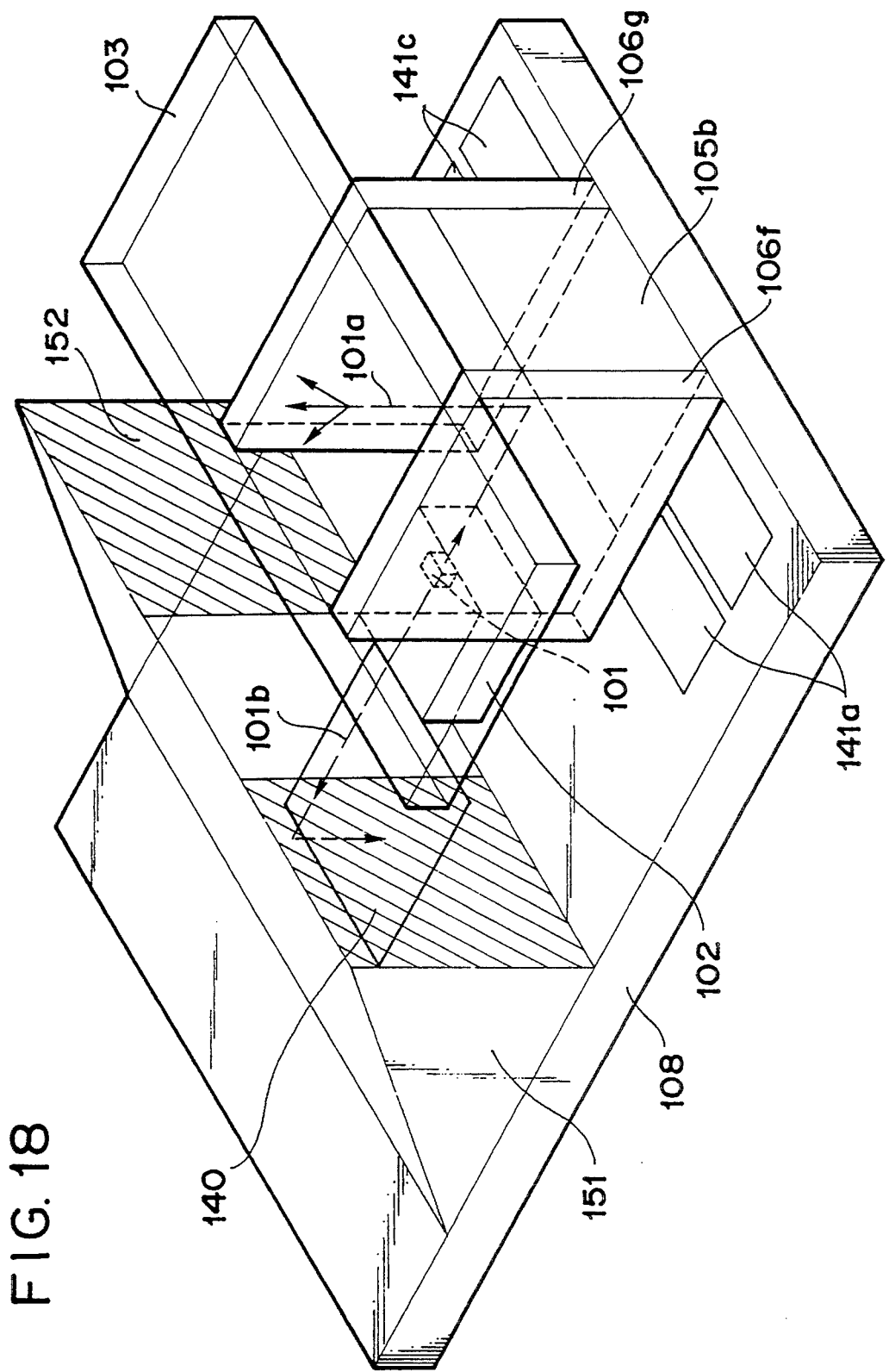
FIG. 18 is a perspective view to show a major part of Embodiment 8 of photosemiconductor apparatus according to the present invention.

FIG. 18 is a schematic view to show a major part of Embodiment 8 of photosemiconductor apparatus according to the present invention.

A great difference of the present embodiment from Embodiment 7 in FIG. 14 is that the reflecting prism 105 is replaced by a single prism 105b and light-receiving elements 141a, 141c for signal light are provided on the both sides of the reflecting prism 105b so as to be shielded by light shield members 106f, 106g.

FIG. 18 is depicted omitting lenses (131a, 131b, 131c) and gratings (132a, 132b, 132c) in the optical unit 103.

In the present embodiment, the output light 101a from one end of the light-emitting element 101 is reflected by the reflecting prism 105b and is guided to irradiate an object through the lens 131b (not shown) and the grating 132b (not shown) in the optical unit 103. Signal light reflected by the object is guided through the grating 132a (132c) and the lens 131a (131c) in the optical unit 103 to enter the light-receiving element 141a (141c).

The above arrangement also makes the projecting light optical path different from the receiving light optical path in the present embodiment. The noise light can be prevented from entering the light-receiving elements 141a, 141c by arranging the two light shield members 106f, 106g on the both sides of reflecting prism 105b. On the other hand, the light beam 101b from the other end of the light-emitting element 101 is guided to enter the light-receiving element 140 for APC through the light-guide prism 151.

By arranging the elements as described, the present embodiment obtains the same effect as in Embodiment 7 in FIG. 14.

In Embodiments 7 and 8 of photosemiconductor apparatus according to the present invention, as described above, if a plurality of light-receiving portions are required, they can be formed on a single semiconductor substrate, which can obviate adjustment of mutual positional relation in mounting them. Further, if amplifiers and processing circuits are built between the light-receiving elements in the substrate, the size of apparatus can be further reduced.

Also, by separating the projecting light optical path from the receiving light optical path and providing the light shield members having the shielding function to independently separate these optical paths, the apparatus can have a high S/N ratio even if its size is compact, can be constructed of a less number of stages of amplifier, and can have a high response frequency and the like.

FIG. 19 to FIG. 22 are schematic views of main part to show Embodiment 1 of production method which can be employed for producing a photosemiconductor apparatus of the present invention, for example the apparatus having the above-described light-emitting element or the photosemiconductor apparatus as described above.

Figure 19:
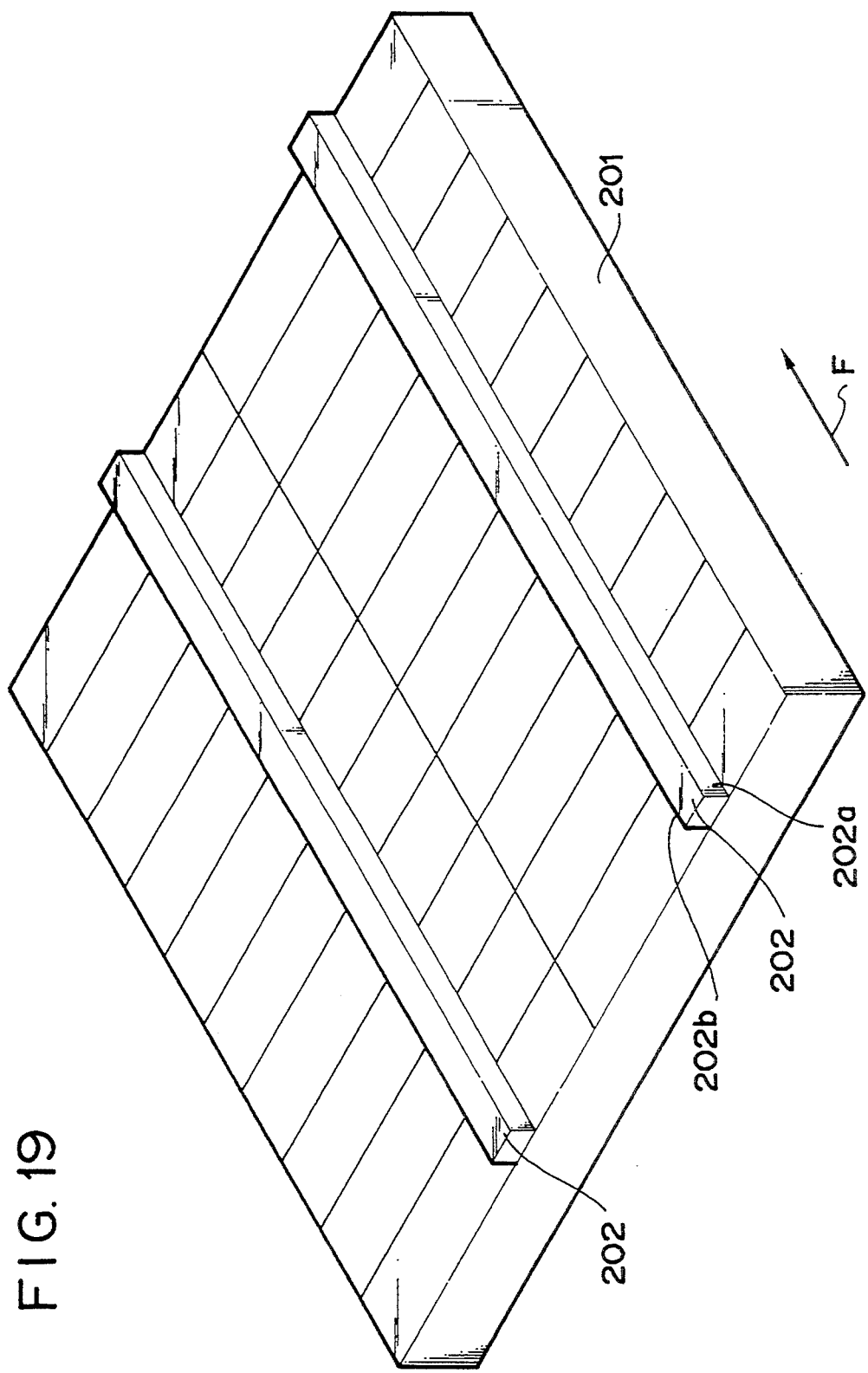
FIG. 19 is a schematic view to show Embodiment 1 of production method of photosemiconductor apparatus according to the present invention.

In the present embodiment, bar-shaped projections 202 each are formed by photolithography and copper plating on a substrate (semiconductor substrate) 201, as shown in FIG. 19. The projections 202 are provided thereon to extend in the predetermined direction shown by the arrow F. Here, lines provided on the substrate 201 define regions to be cut and separated as detailed later.

A point for forming the projections 202 is that the plating deposition does not exceed the resist height with partial plating for forming the projections 202 because the two side planes 202a, 202b of each projection 202 are used later as butt (face-to-face) contact planes. The position of each projection 202 is determined based on optical design so that each end of position to mount a prism 205 as optical element and a plurality of laser diodes 204 as light-emitting elements is made coincident with either end of projection 202.

Figure 20:
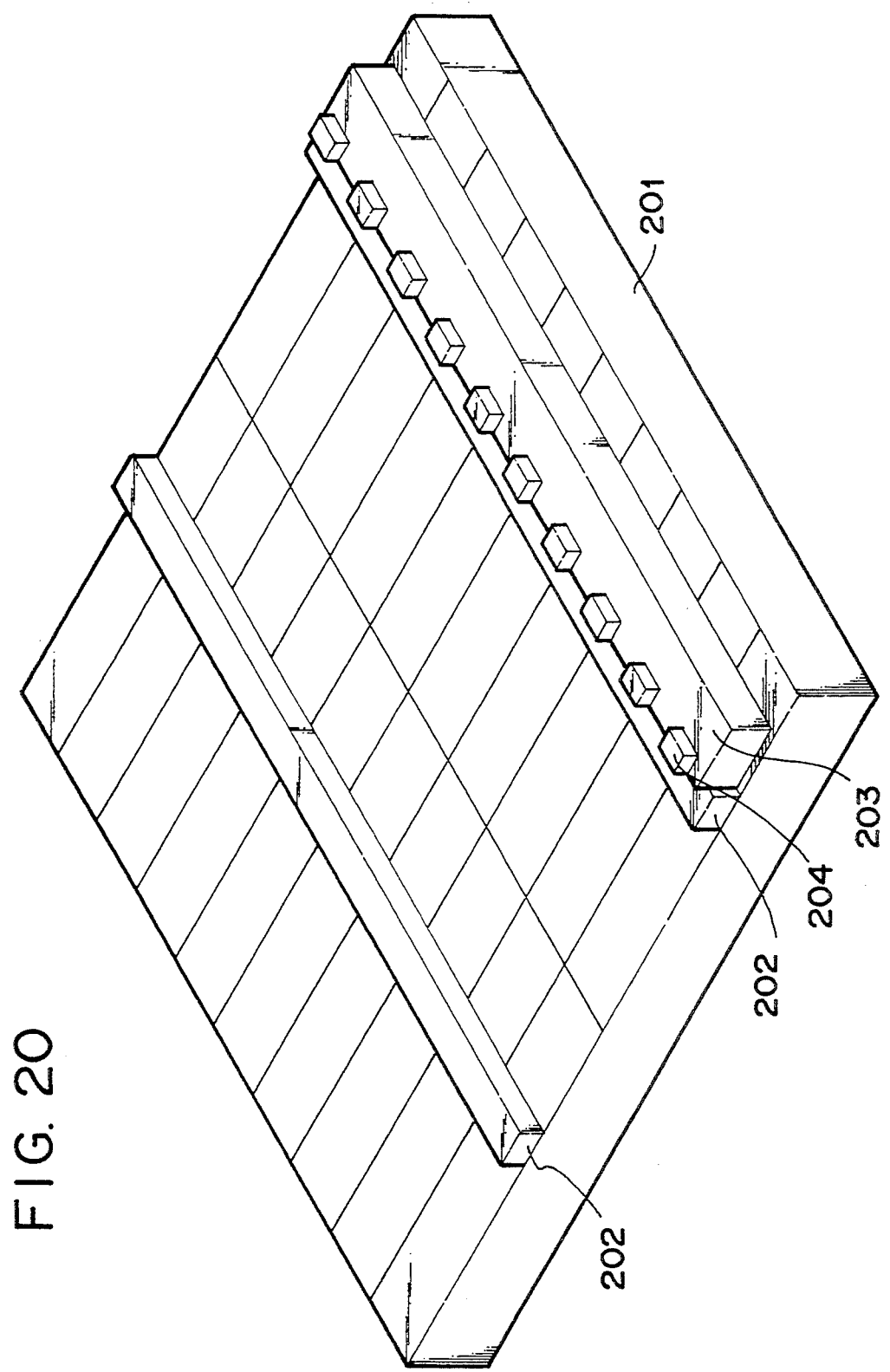
FIG. 20 is a schematic view to show Embodiment 1 of production method of photosemiconductor apparatus according to the present invention.

Then each sub-mount 203 in which laser diodes (light-emitting elements) 204 are mounted on Si bar at high precision is placed on the substrate 201 in a face-to-face relation with a side plane 202a of projection 202, as shown in FIG. 20. Then the each sub-mount 203 is bonded to the substrate 201 by solder. The mounting technique of laser diodes on the Si bar is carried out with very high precision to make each end face of laser diode coincident with an end plane of sub-mount 203. Thus, since the each emission end face is coincident with the end plane of sub-mount 203 at very high precision by the above technique, the butt contact of the Si bar 203 with the side plane 202a results in having the same effect as a butt contact of each end face of laser diode 204 with the side face 202a.

Figure 21:
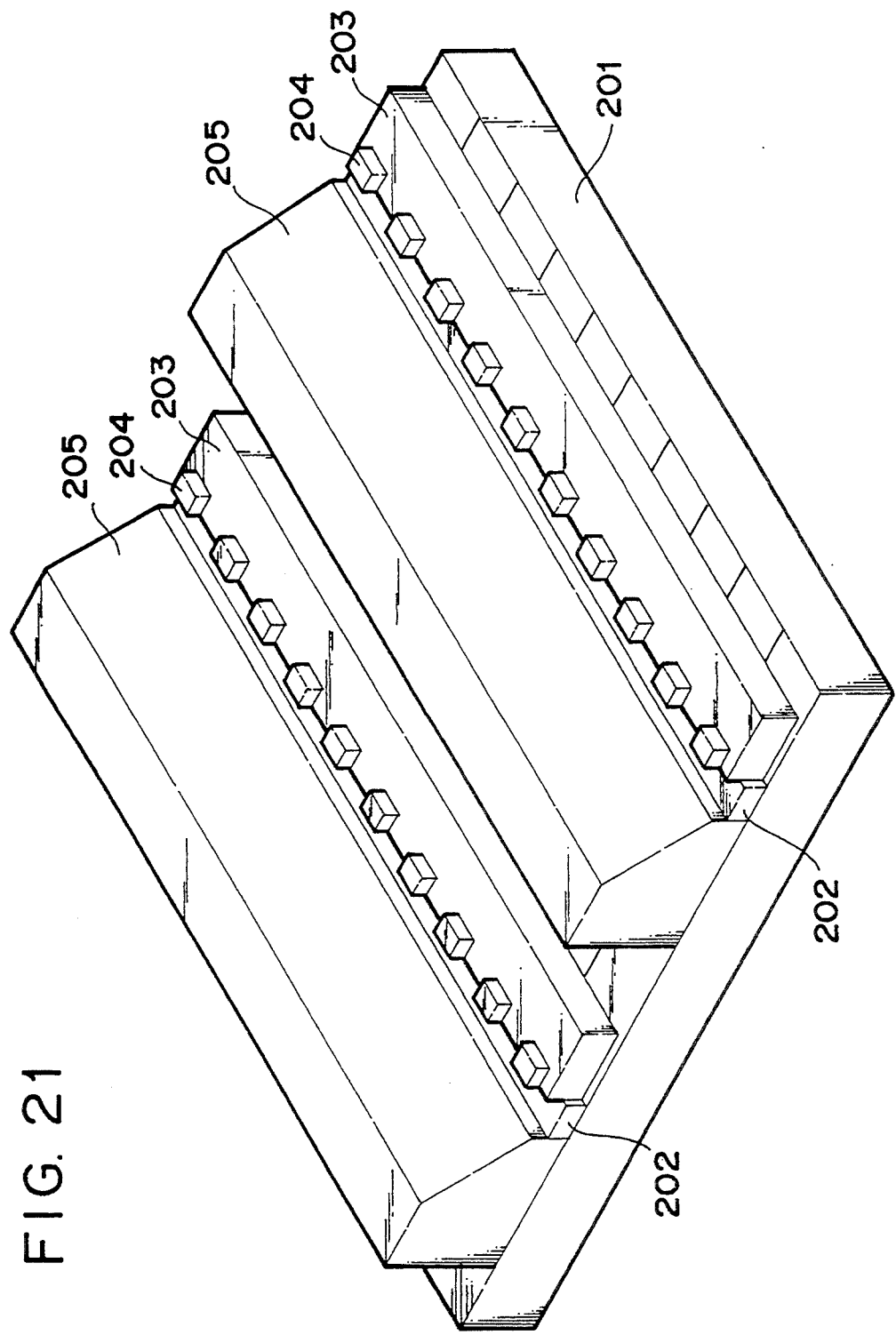
FIG. 21 is a schematic view to show Embodiment 1 of production method of photosemiconductor apparatus according to the present invention.
Figure 22:
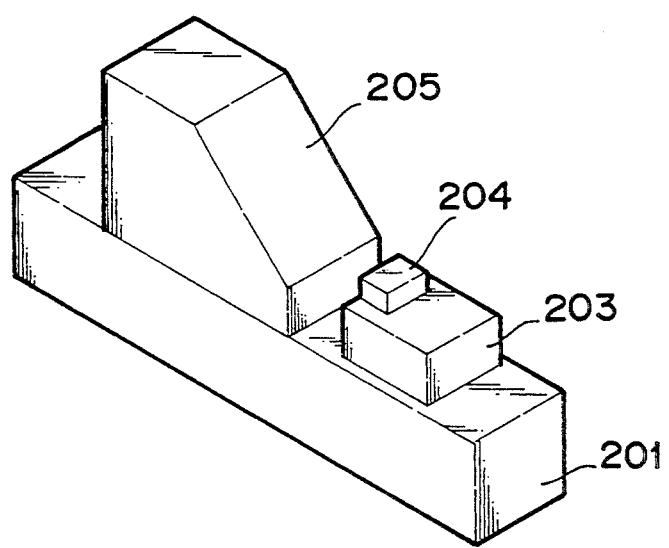
FIG. 22 is a schematic view to show Embodiment 1 of production method of photosemiconductor apparatus according to the present invention.

Next, each reflecting prism 205, which is a bar-shaped optical element extending in the direction of arrow F, is placed on the substrate in a face-to-face relation with another side face 202b of projection 202, as shown in FIG. 21. The each reflecting prism 205 is bonded by an adhesive onto the substrate 201. After that, the projections 202 are removed by etching. Then the prisms 205 and the Si bars 203 mounted on the substrate 201 are cut together with a dicing saw, thereby obtaining photosemiconductor apparatus as shown in FIG. 22.

By the above-described method, the present embodiment obtains photosemiconductor apparatus which can have an accurate position as for light emitting point and which can emit light beam upwardly in a horizontal arrangement.

In the present embodiment, the substrate 201 may be made of glass, ceramic, composite material, silicon, gallium arsenide, or the like. The contour and the size of substrate are arbitrary as long as a plurality of desired photosemiconductor apparatus can be obtained from a single substrate (semiconductor substrate).

From the viewpoint of production procedure order in the present embodiment, as many photosemiconductor apparatus are included in the procedure as possible to reduce the production cost. The substrate may include electric wiring, an electric circuit or an integrated circuit formed thereon.

There are various methods applicable for the step of forming the projections 202 on the substrate 201. For example, a method is such that a photosensitive resin such as photoresist is applied or bonded onto the substrate and that projections are formed at a desired position in desired size with a mask. Another method is such that an inorganic material such as $SiO_2$ is vapor-deposited or applied onto the substrate and projections are formed by etching. A further method is such that an electrode layer is first formed on the entire surface of substrate, a photoresist is deposited on the electrode layer except for the projection portion, where the electrode layer is exposed, then projections are formed by plating, and the resist and the electrode layer except for the projection portion are removed by etching to obtain the projections.

Since the projections are obtained using the photolithography with the above methods, an error to a designed value lies within a range of several $\mu$m to ten and a few $\mu$m in either method, which is extremely high precision.

Although it is preferably that the projections 202 can be removed after the prisms 205 and the light-emitting elements 204 and the like are mounted on the substrate, the removal is not always necessary as long as the projections do not affect the optical relation between the light-emitting element and the prism 205.

There are bar-shaped optical elements, such as lens rod, in addition to the prism 205, which are mounted in butt contact with each projection and fixed by an adhesive.

The light-emitting element 204 may be a laser diode, an SHG element and a laser diode, SLD, LED, and the like. In case of using the laser diode, a sub-mount 203 is made of a material having a high thermal conductivity and a coefficient of thermal expansion close to that of GaAs in respect of heat radiation and reliability, for example silicon, diamond, CBN, and the like.

In the present embodiment, the light-emitting element may be a unit in which a laser diode is mounted with high precision on a sub-mount, as well as the laser diode 204. These light-emitting elements are brought into butt contact with the side face of projection 202 as described above, and bonded to the substrate 201 by applying a soldering material such as solder thereto.

Figure 23:
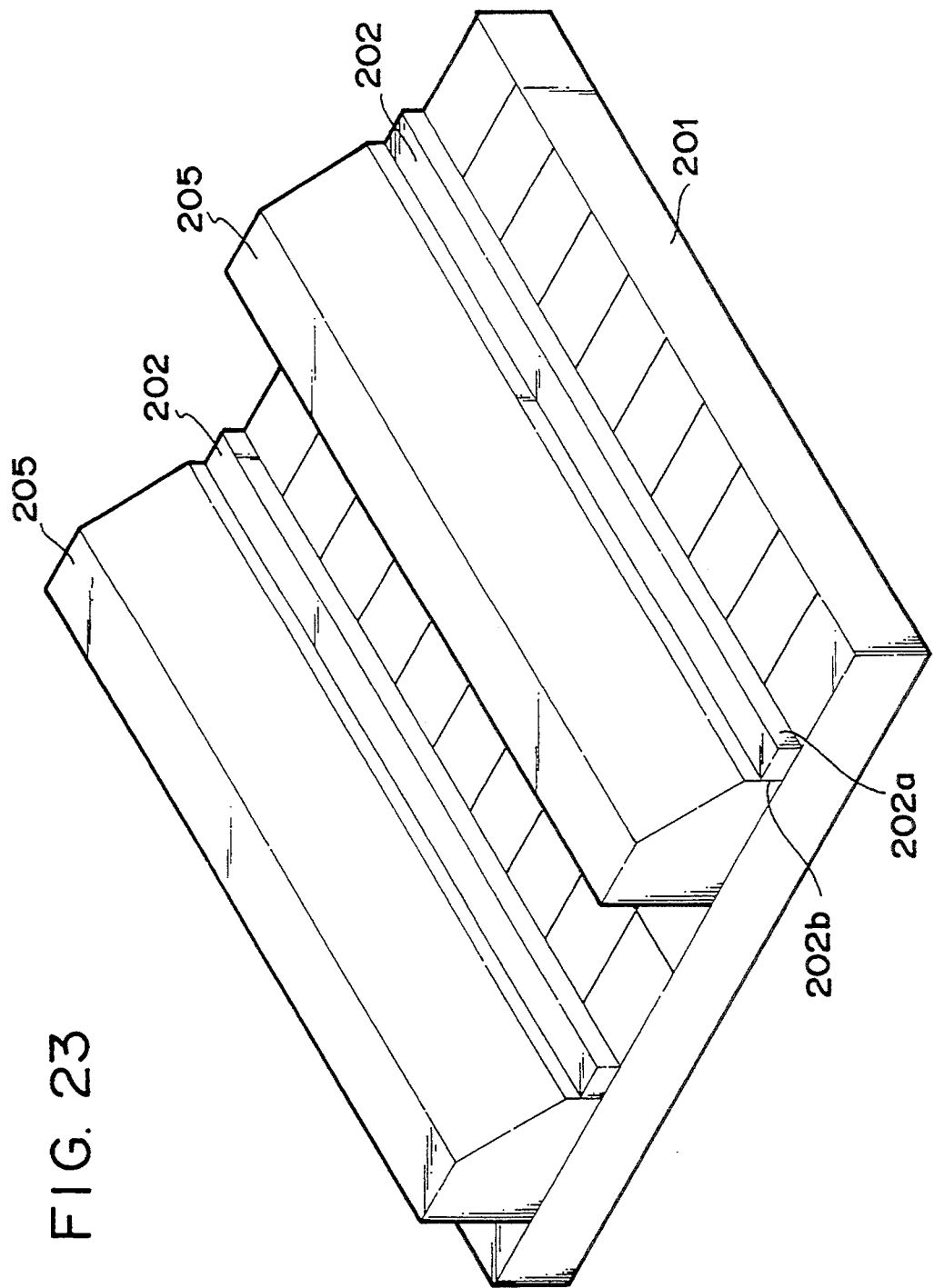
FIG. 23 is a schematic view to show Embodiment 2 of production method of photosemiconductor apparatus according to the present invention.
Figure 24:
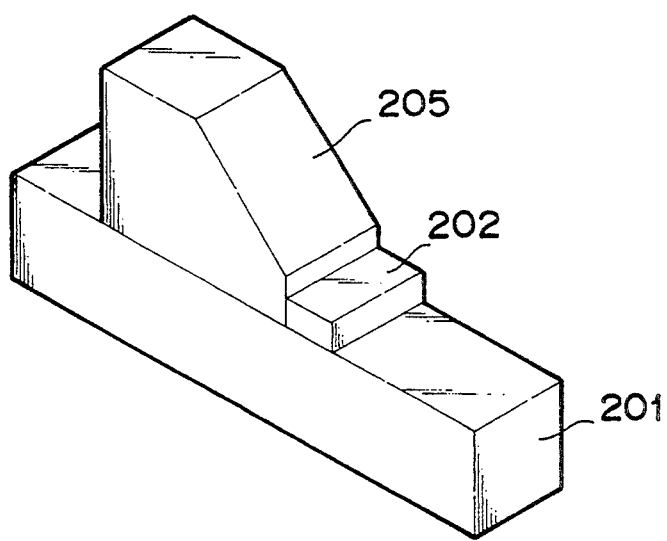
FIG. 24 is a schematic view to show Embodiment 2 of production method of photosemiconductor apparatus according to the present invention.
Figure 25:
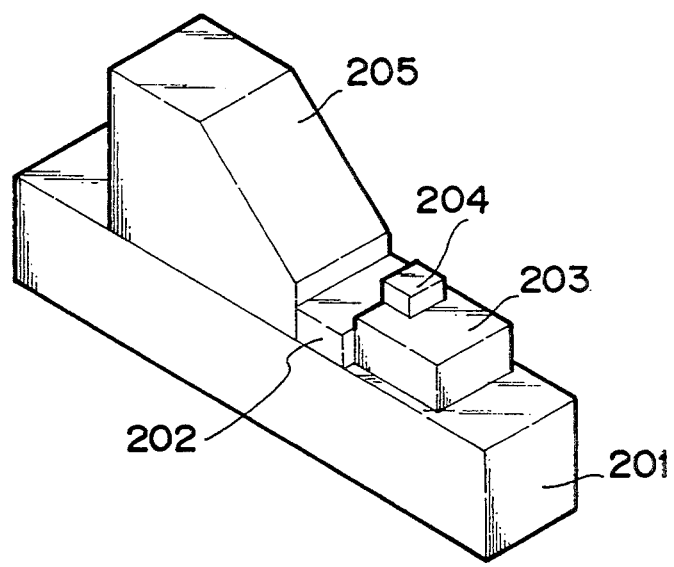
FIG. 25 is a schematic view to show Embodiment 2 of production method of photosemiconductor apparatus according to the present invention.
Figure 26:
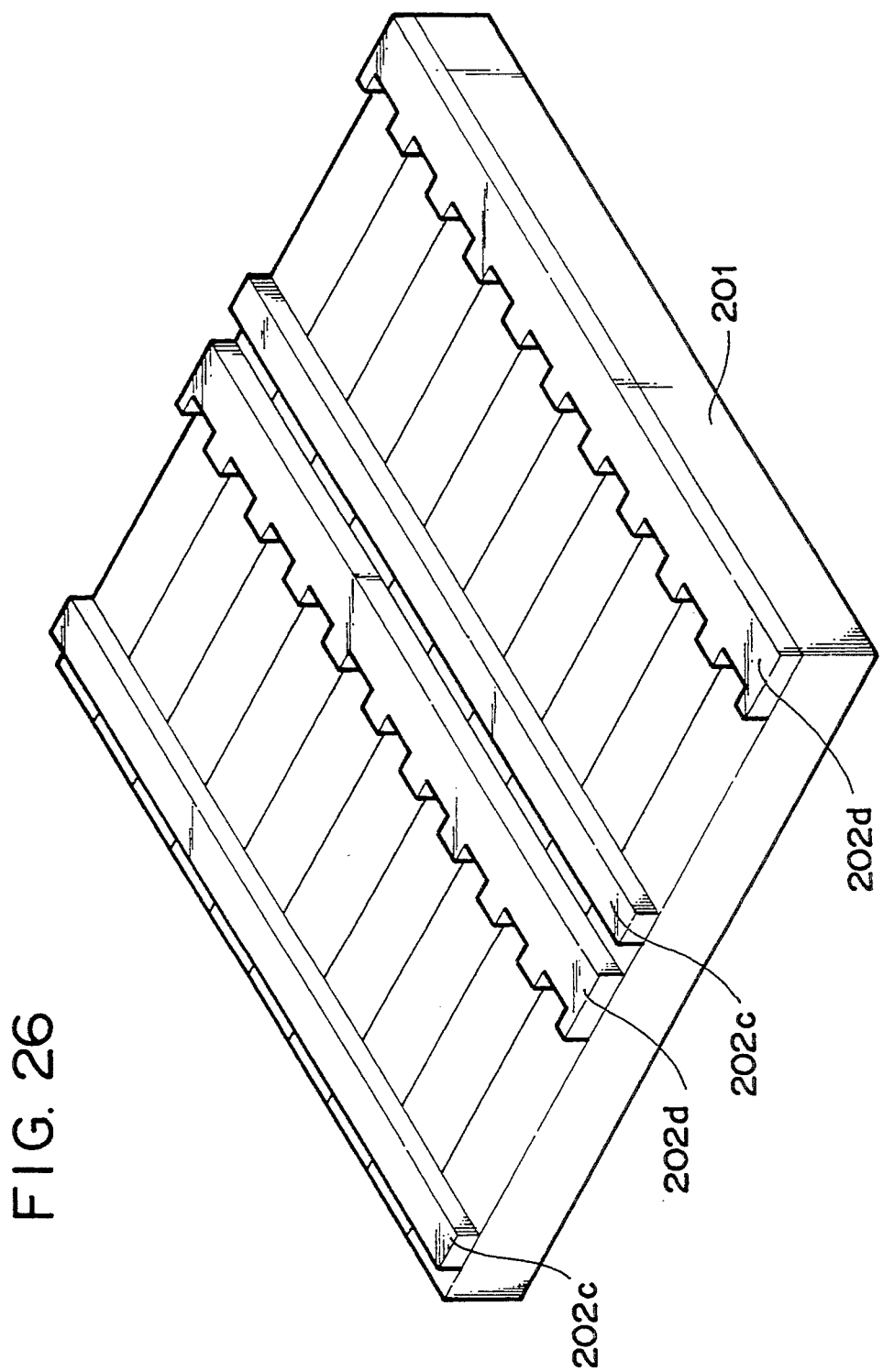
FIG. 26 is a schematic view to show Embodiment 3 of production method of photosemiconductor apparatus according to the present invention.
Figure 27:
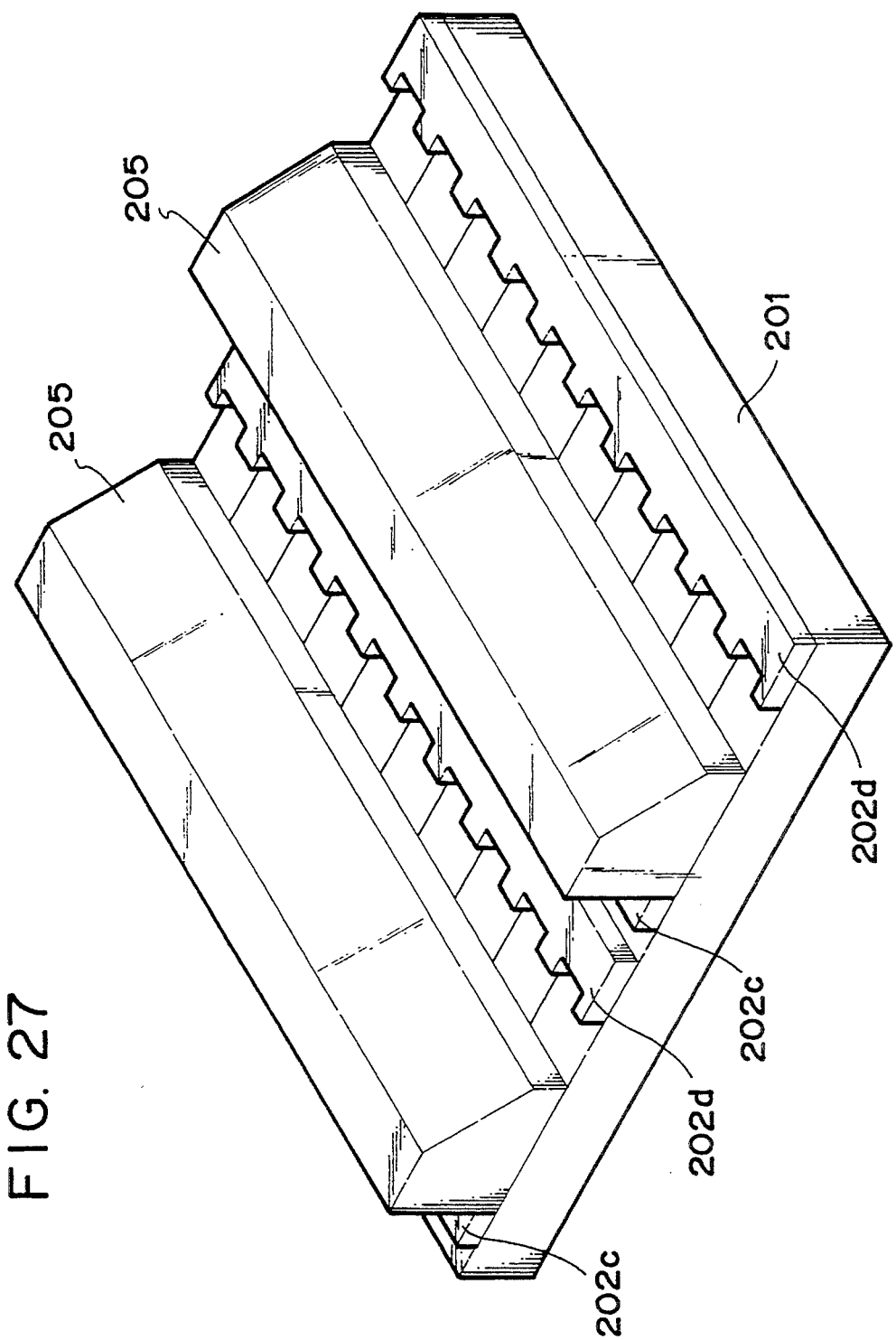
FIG. 27 is a schematic view to show Embodiment 3 of production method of photosemiconductor apparatus according to the present invention.
Figure 28:
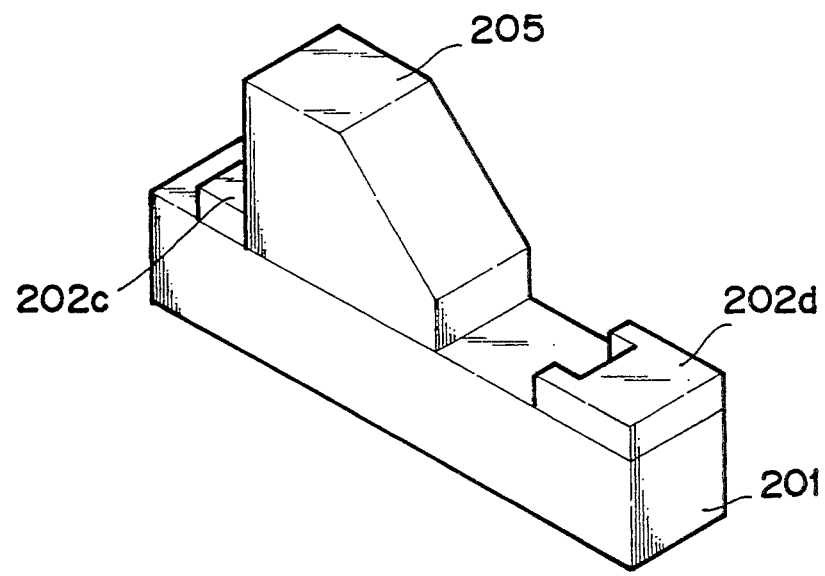
FIG. 28 is a schematic view to show Embodiment 3 of production method of photosemiconductor apparatus according to the present invention.
Figure 29:
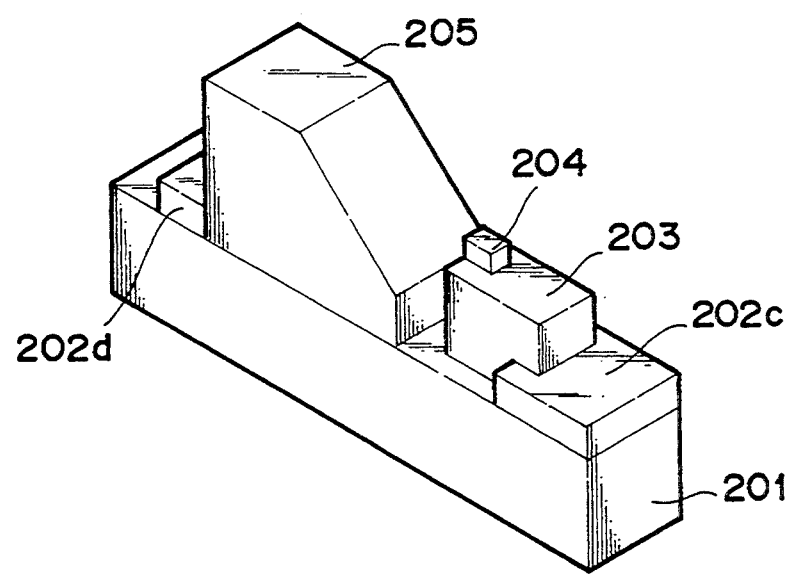
FIG. 29 is a schematic view to show Embodiment 3 of production method of photosemiconductor apparatus according to the present invention.

FIG. 23 to FIG. 25 are schematic views to show a major part of Embodiment 2 of production method of photosemiconductor apparatus according to the present invention.

In the present embodiment, projections 202 are formed on a substrate 201 in the same manner as in Embodiment 1 shown in FIG. 19 to FIG. 22, and bar-shaped reflecting prisms 205 each are brought into butt contact with the side face 202b of projection 202 and fixed to the substrate 201 by an adhesive, as shown in FIG. 23.

Then the reflecting prisms 205, the projections 202 and the substrate 201 are cut together with a dicing saw to obtain a single of unit shown in FIG. 24. For each cut unit, as shown in FIG. 25, a light-emitting element in which a laser diode 204 is mounted on a Si sub-mount 203 with such a high precision that the end face of Si sub-mount 203 is coincident with the emission end face of laser diode 204, is placed on the substrate 201 while the Si sub-mount 203 is made in butt contact with the side plane 202a of projection 202, and the sub-mount is bonded to the substrate 201 with solder in that state. The projections 202 are then removed by etching, thereby obtaining photosemiconductor apparatus.

FIG. 26 to FIG. 29 are schematic views to show a major part of Embodiment 3 of production method of photosemiconductor apparatus according to the present invention.

The present embodiment is different from Embodiment 1 in FIG. 19 to FIG. 22 and Embodiment 2 in FIG. 23 to FIG. 25 in that there are provided on the surface of substrate 201, projections 202c for reflecting prism 205 and projections 202d for sub-mount 203 on which laser diodes 204 are mounted. A prism 205 or a sub-mount 203 is arranged with reference to each projection 202c or 202d, respectively. The other arrangement is the same as that in Embodiment 2 in FIG. 23 to FIG. 25.

Since projections 202c, 202d are not provided on optical path portion in the present embodiment, the step of removing the projections is unnecessary. Therefore, the cost reduction is possible by this embodiment.

As described above, the production methods of photosemiconductor apparatus according to the present invention are so arranged that projections are provided on a substrate and optical elements are brought into butt contact with the projections and then cut together with the substrate, whereby even too small optical elements can be readily handled and mounted with high precision. Also, the light-emitting element is mounted in butt contact with projection, which enables high precision mounting. The provision of projections as reference enables very simple but high precision mounting even for too small elements, and size reduction of optical elements in low cost.

What is claimed is:

1. A photosemiconductor apparatus comprising:
   a light-emitting element provided on a substrate, said light-emitting element for emitting light;
   a plurality of light receiving elements provided on said substrate; and
   an integrally-formed light-guide member which is disposed on said substrate and which is divided into plural light-guide elements by way of light-absorbing members therebetween, a different one of said plural light-guide elements being provided in correspondence to each of said plurality of light receiving elements, each of the plural light-guide elements for guiding light into a corresponding one of said plurality of light-receiving elements; said light-guide member comprising a prism.

2. A photosemiconductor apparatus according to claim 1, further comprising a plurality of light-shielding members for respectively restricting light from incidence on said plurality of light-guide elements.

3. A photosemiconductor apparatus according to claim 1, wherein light incident on at least one of said plurality of light-receiving elements is generated by reflecting light emitted by said light-emitting element from an object, whereby information on motion of the object is obtained by said one of said plurality of light-receiving elements.

* * * * *

UNITED STATES PATENT AND TRADEMARK OFFICE
CERTIFICATE OF CORRECTION

PATENT NO. : 5,438,586
DATED : August 1, 1995
INVENTOR(S) : SATOSHI ISHII, ET AL.

It is certified that error appears in the above-identified patent and that said Letters Patent is hereby corrected as shown below:

ON TITLE PAGE

In [56] References Cited, under FOREIGN PATENT DOCUMENTS:
"4162222  6/1992  Japan" should read
--4-162222  6/1992  Japan--.

COLUMN 1

Line 23, "tus" should read --tuses--.

COLUMN 11

Line 33, "preferably" should read --preferable--.

COLUMN 12

Line 1, "of" should be deleted.
Line 55, "elements; said" should read --elements, said--.

Signed and Sealed this

Twenty-first Day of November, 1995

Attest:

BRUCE LEHMAN

Attesting Officer

Commissioner of Patents and Trademarks